United States Patent
Cha et al.

(10) Patent No.: US 7,812,644 B2
(45) Date of Patent: Oct. 12, 2010

(54) DIGITAL FREQUENCY DETECTOR AND DIGITAL PHASE LOCKED LOOP USING THE DIGITAL FREQUENCY DETECTOR

(75) Inventors: Choong-yul Cha, Yongin-si (KR); Tae-wook Kim, Suwon-si (KR); Jae-sup Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 96 days.

(21) Appl. No.: 11/971,654

(22) Filed: Jan. 9, 2008

(65) Prior Publication Data
US 2008/0315921 A1 Dec. 25, 2008

(30) Foreign Application Priority Data
Jun. 25, 2007 (KR) .................. 10-2007-0062354

(51) Int. Cl.
*G01R 25/00* (2006.01)
*H03D 13/00* (2006.01)
(52) U.S. Cl. .................. 327/3; 327/5; 327/7; 327/8
(58) Field of Classification Search .......... 327/3, 327/7, 8
See application file for complete search history.

(56) References Cited

U.S. PATENT DOCUMENTS 5,416,444 A * 5/1995 Yamauchi et al. .......... 331/45
6,219,394 B1   4/2001 Sander
6,351,164 B1 * 2/2002 Yoshie .................... 327/156
6,429,693 B1 * 8/2002 Staszewski et al. ......... 327/12
7,084,670 B1 * 8/2006 Chiu ......................... 327/5
7,304,510 B2 * 12/2007 Matsuta .................... 327/3

FOREIGN PATENT DOCUMENTS

WO   2007/054902 A1   5/2007

OTHER PUBLICATIONS

Communication from the State Intellectual Property Office of P.R. China issued Jul. 20, 2010, in counterpart Chinese Application No. 200810107801.2

* cited by examiner

*Primary Examiner*—Lincoln Donovan
*Assistant Examiner*—John W Poos
(74) *Attorney, Agent, or Firm*—Sughrue Mion, PLLC

(57) ABSTRACT

A digital frequency detector and a digital phase locked loop (PLL) are provided. The digital frequency detector includes a first conversion unit which outputs a first frequency as first frequency information of a digital type using a first ring oscillator that operates in a high-level period of the first frequency, a second conversion unit which outputs a second frequency as second frequency information of a digital type using a second ring oscillator that operates in a high-level period of the second frequency, and an operation unit which outputs a digital frequency for the first frequency by calculating a ratio of the first frequency information to the second frequency information.

19 Claims, 7 Drawing Sheets

DIGITAL FREQUENCY DETECTOR AND DIGITAL PHASE LOCKED LOOP USING THE DIGITAL FREQUENCY DETECTOR

CROSS-REFERENCE TO RELATED APPLICATIONS

This application claims priority from Korean Patent Application No. 10-2007-0062354, filed on Jun. 25, 2007 in the Korean Intellectual Property Office, the disclosure of which is incorporated herein by reference in its entirety.

BACKGROUND OF THE INVENTION

1. Field of the Invention

Apparatuses consistent with the present invention relate to a digital frequency detector and a digital phase locked loop (PLL) using the digital frequency detector. More particularly, apparatuses consistent with the present invention relate to a digital frequency detector for use in a digital PLL or a frequency synthesizer, and a digital PLL using the digital frequency detector.

2. Description of the Related Art

Generally, a PLL is used to obtain an output signal having a fixed phase and frequency by sensing and controlling the change of the phase and frequency that may occur in peripheral environments.

FIG. 1 is a block diagram schematically illustrating the construction of a related PLL.

Referring to FIG. 1, a PLL comprises a phase frequency detector (PFD) 10, a charge pump 30, a loop filter 50, a voltage controlled oscillator (VCO) 70, and a divider 90.

The PFD 10 compares an input frequency $F_{cc}$ with a frequency output from the divider 90 to be described later, and outputs a pulse string corresponding to a difference between the two frequencies.

The charge pump 30 pushes or pulls current that is in proportion to a width of the pulse output from the PFD 10 in accordance with a pulse code. In the process of converting the pulse into the current as described above, a current gain is produced to exert a great influence upon the performance of the PLL including a lock time for which the output of the PLL is stabilized.

The loop filter 50 has a structure of a low pass filter, and filters noise generated during the operation of the loop. The loop filter 50 varies the voltage of a control terminal of the VCO 70 by changing the amount of charge accumulated using capacitors.

The VCO 70 outputs a specified frequency $F_{vco}$, which is a high frequency, in accordance with the voltage output from the loop filter 50.

The divider 90 divides the output frequency $F_{vco}$ of the VCO 70 to output a frequency that comparable with the input frequency $F_{cc}$ provided to the PFD 10.

As described above, the PLL is a circuit that processes the frequency in an analog form, and an analog type circuit has a high sensitivity to external noise if the supply voltage is reduced. According to recent semiconductor processes, there is a growing tendency that a speed of a transistor is increased while a supply voltage is reduced, and due to this, circuits, which had been designed in an analog domain, are now being designed in a digital domain.

The tendency also appears in the field of PLLs. In implementing a digital PLL, the biggest problem is that the accuracy of the digital PLL is lowered in the case of converting the high frequency signal output from the VCO into a digital signal. The problem occurs not only in the digital PLL but also in a frequency synthesizer and the like, designed in the digital domain.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a digital frequency detector that can detect the frequency of a high frequency signal as a digital signal having a high precision to improve the performance of a digital circuit in designing a circuit, which had been designed in an analog domain, in a digital domain, and a digital PLL using the digital frequency detector.

According to an aspect of the present invention, there is provided a digital frequency detector, which comprises a first conversion unit which outputs a first frequency as first frequency information of a digital type using a first ring oscillator that operates in a high-level period of the first frequency; a second conversion unit which outputs a second frequency as second frequency information of a digital type using a second ring oscillator that operates in a high-level period of the second frequency; and an operation unit which outputs a digital frequency for the first frequency by calculating a ratio of the first frequency information to the second frequency information.

The first frequency information and the second frequency information of the digital type may be information in which fractional frequency information and integer frequency information are added together.

The second frequency may be generated through a crystal, and may be a frequency the size of which can be known.

The first ring oscillator and the second ring oscillator may operate at the same frequency.

The first ring oscillator may either comprise a NAND gate and an even number of inverters as delay elements, or be implemented as a differential type oscillator.

The first conversion unit may comprise a first latch unit which temporarily stores states of signals passing through the respective delay elements at a falling edge of the first frequency, and outputs the state signal as delay information of the first ring oscillator, the first latch unit comprising latches the number of which corresponds to the number of delay elements provided in the first ring oscillator; a first edge detection unit which detects the delay element that makes the state of the delay information be changed from "1" to "0"; a first encoder unit which encodes the position of the delay element detected by the first edge detection unit to binary information, and outputs the encoded signal as fractional frequency information of the first ring oscillator; a first counter unit which counts a period of the first ring oscillator, and outputs counted value as integer frequency information; and a first addition unit which outputs the first frequency information obtained by adding the fractional frequency information to the integer frequency information.

The first counter unit may count a clock signal output from the first ring oscillator from a rising edge to the falling edge of the first frequency, and output the counted value as the integer frequency information.

The second conversion unit may comprise a second latch unit which temporarily stores states of signals passing through the respective delay elements at a falling edge of the second frequency, and outputs the state signal as delay information of the second ring oscillator, the second latch unit comprising latches the number of which corresponds to the number of delay elements provided in the second ring oscillator; a second edge detection unit which detects the delay element that makes the state of the delay information be changed from "1" to "0"; a second encoder unit which encodes the position of the delay element detected by the second edge detection unit to binary information, and outputs the encoded signal as fractional frequency information of the second ring oscillator; a second counter unit which counts a period of the second ring oscillator, and outputs the counted value as integer frequency information; and a second addition unit which outputs the second frequency information obtained by adding the fractional frequency information to the integer frequency information.

The second counter unit may count a clock signal output from the second ring oscillator from a rising edge to the falling edge of the second frequency, and output the counted value as the integer frequency information.

According to another aspect of the present invention, there is provided a digital frequency detector, which comprises a quantization unit which quantizes a first frequency and a second frequency using a ring oscillator; a first conversion unit which outputs the first frequency as first frequency information of a digital type using quantized information of the first frequency; a second conversion unit which outputs the second frequency as second frequency information of a digital type using quantized information of the second frequency; and an operation unit which outputs a digital frequency for the first frequency by calculating a ratio of the first frequency information to the second frequency information.

The first frequency information and the second frequency information of the digital type may be information in which fractional frequency information and integer frequency information are added together.

The second frequency may be generated through a crystal, and may be a frequency the size of which can be known.

The ring oscillator may either comprise an odd number of inverters provided in a feedback loop as delay elements, or be implemented as a differential type oscillator.

The quantization unit may comprise a first latch unit which temporarily stores states of signals passing through the respective delay elements at a falling edge of the first frequency, and outputs the state signal as first delay information of the ring oscillator, the first latch unit comprising latches the number of which corresponds to the number of delay elements provided in the ring oscillator; a second latch unit which temporarily stores states of signals passing through respective delay elements at a falling edge of the second frequency, and outputs the state signal as second delay information of the ring oscillator, the second latch unit comprising latches the number of which corresponds to the number of delay elements provided in the ring oscillator; and a counter unit which outputs first integer phase information by counting a period of the ring oscillator for a period of the first frequency, and outputs second integer phase information by counting the period of the ring oscillator for a period of the second frequency.

The first conversion unit may comprise a first edge detection unit which detects the delay element that makes the state of the first delay information be changed from "1" to "0"; a first encoder unit which encodes the position of the delay element detected by the first edge detection unit to binary information, and outputs the encoded signal as first fractional phase information of the ring oscillator; a first addition unit which outputs first phase information obtained by adding the first fractional phase information to the first integer phase information; and a first differentiator which differentiates the first phase information and outputs the differentiated first phase information as the first frequency information.

The second conversion unit may comprise a second edge detection unit which detects the delay element that makes the state of the second delay information be changed from "1" to "0"; a second encoder unit which encodes the position of the delay element detected by the second edge detection unit to binary information, and outputs the encoded signal as second fractional phase information of the ring oscillator; a second addition unit which outputs second phase information obtained by adding the second fractional phase information to the second integer phase information; and a second differentiator which differentiates the second phase information and outputs the differentiated second phase information as the second frequency information.

The digital frequency detector according to embodiments of the present invention may further comprise a re-timer which rearranges the first frequency and the second frequency using a clock signal generated from the ring oscillator and provides the rearranged frequencies as clock signals of the first conversion unit and the second conversion unit, respectively.

The re-timer may comprise a first latch which latches the first frequency according to the clock signal generated from the ring oscillator; and a second latch which latches the second frequency according to the clock signal generated from the ring oscillator.

According to another aspect of the present invention, there is provided a digital phase locked loop (PLL), which comprises a detection unit which compares a first digital frequency with a second digital frequency and outputs an error value corresponding to a difference between the first and second digital frequencies; a filter unit which adjusts and outputs a control value for controlling an output frequency according to the error value output from the detection unit so that the error value is included within a predetermined permitted limit; an oscillator which outputs a high-frequency oscillation frequency by controlling a fixed frequency input from a fixed frequency oscillator according to the control value output from the filter unit; and a digital frequency detector which outputs a second digital frequency using a ratio of digital-type frequency information of the oscillation frequency to digital-type frequency information of a reference frequency the size of which is known.

The digital PLL according to embodiments of the present invention may further comprise a divider which divides the high-frequency oscillation frequency output from the oscillator by a specified integer and outputting the divided frequency as a low-frequency oscillation frequency; and a multiplier which multiplies the second digital frequency output from the digital frequency detector by the integer and outputs the multiplied frequency as the second high-frequency digital frequency.

The digital frequency detector may comprise a first conversion unit which outputs a first frequency as first frequency information of a digital type using a first ring oscillator that operates in a high-level period of the first frequency; a second conversion unit which outputs a second frequency as second frequency information of a digital type using a second ring oscillator that operates in a high-level period of the second frequency; and an operation unit which outputs a digital frequency for the first frequency by calculating a ratio of the first frequency information to the second frequency information.

Alternatively, the digital frequency detector may comprise a quantization unit which quantizes a first frequency and a second frequency using a ring oscillator; a first conversion unit which outputs the first frequency as first frequency information of a digital type using quantized information of the first frequency; a second conversion unit which outputs the second frequency as second frequency information of a digital type using quantized information of the second frequency; and an operation unit which outputs a digital frequency for the first frequency by calculating a ratio of the first frequency information to the second frequency information.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS

Figure 1:
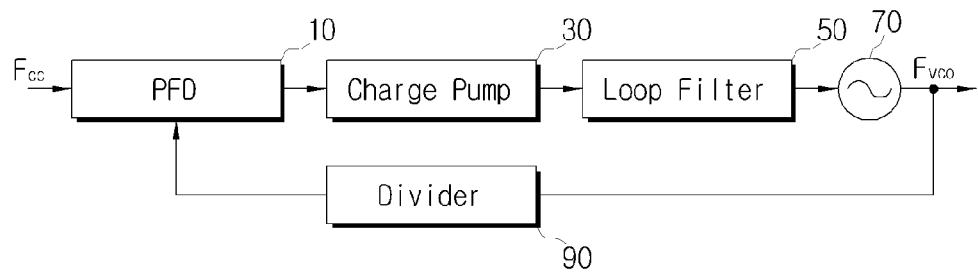
FIG. 1 is a block diagram schematically illustrating the construction of a related art PLL.

Certain exemplary embodiments of the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. Also, well-known functions or constructions are not described in detail since in order to prevent obscuring the invention with unnecessary detail.

Figure 2:
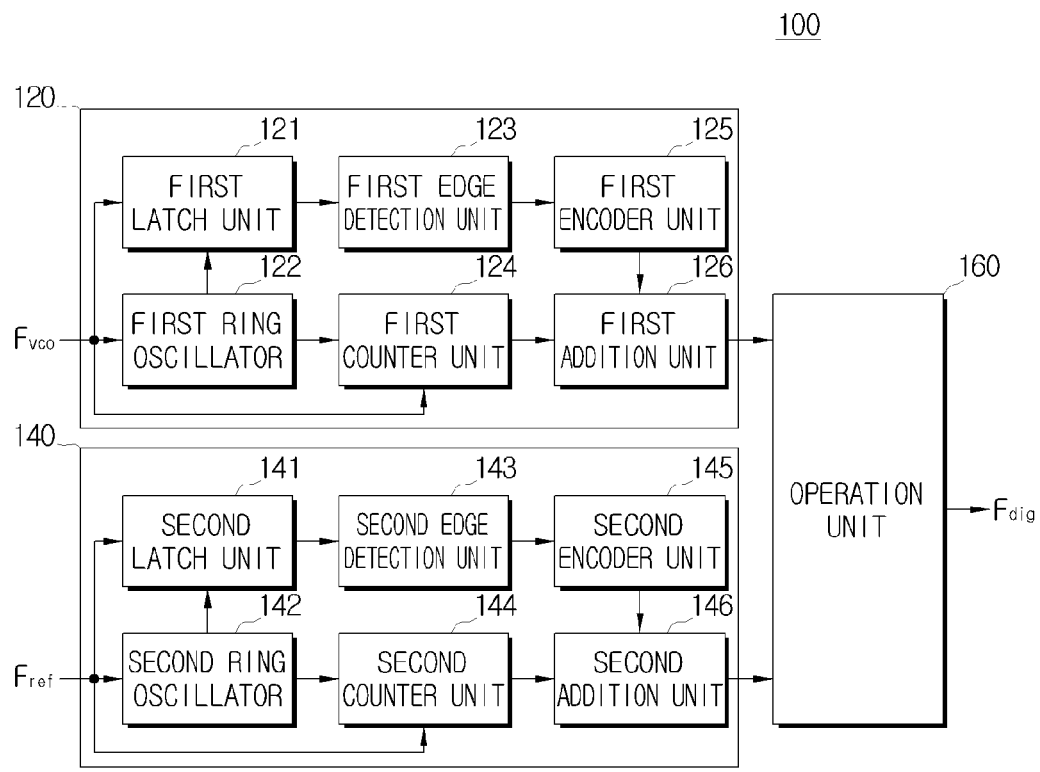
FIG. 2 is a block diagram schematically illustrating the construction of a digital frequency detector according to an exemplary embodiment of the present invention.

FIG. 2 is a block diagram schematically illustrating the construction of a digital frequency detector according to an exemplary embodiment of the present invention.

Referring to FIG. 2, the digital frequency detector 100 according to an exemplary embodiment of the present invention comprises a first conversion unit 120, a second conversion unit 140, and an operation unit 160.

The first conversion unit 120 converts an oscillation frequency $F_{vco}$ into a digital signal, and comprises a first latch unit 121, a first ring oscillator 122, a first edge detection unit 123, a first counter unit 124, a first encoder unit 125, and a first addition unit 126.

The first ring oscillator 122 comprises a plurality of delay elements connected to a feedback loop, and generates a clock signal of a predetermined frequency. The first ring oscillator 122 operates when the oscillation frequency $F_{vco}$ is at a high level and does not operate when the oscillation frequency $F_{vco}$ is at a low level.

The first latch unit 121 comprises a plurality of latches, the number of which corresponds to the number of delay elements provided in the first ring oscillator 122. The first latch unit 214 temporarily stores states of signals passing through the respective delay elements at a falling edge of the oscillation frequency $F_{vco}$, and outputs the state signal as first delay information of the first ring oscillator 122.

The first edge detection unit 123 detects the delay element that makes a state of the first delay information output from the first latch unit 121 be changed from "1" to "0".

The first encoder unit 125 encodes a position of the delay element detected by the first edge detection unit 132 into binary information, and outputs the encoded signal as first fractional frequency information of the first ring oscillator 122.

The first counter unit 124 counts a period of the first ring oscillator 122, and outputs counter information. That is, the counter unit 124 counts the clock signal output from the first ring oscillator 122 from a rising edge to a falling edge of the oscillation frequency $F_{vco}$, and outputs first integer frequency information.

The first addition unit 126 outputs the first frequency information obtained by adding the first fractional frequency information output from the first encoder unit 125 to the first integer frequency information output from the first counter unit 124.

The second conversion unit 140 converts a reference frequency $F_{ref}$ into a digital signal, and comprises a second latch unit 141, a second ring oscillator 142, a second edge detection unit 143, a second counter unit 144, a second encoder unit 145, and a second addition unit 146. Here, the reference frequency $F_{ref}$ is generated through a crystal, and is a frequency the size of which can be known.

The second ring oscillator 142 comprises a plurality of delay elements connected to a feedback loop, and generates a clock signal having the same frequency as the first ring oscillator 122. The second ring oscillator 142 operates when the reference frequency $F_{ref}$ is at a high level and does not operate when the reference frequency $F_{ref}$ is at a low level.

The second latch unit 141 comprises a plurality of latches, the number of which corresponds to the number of delay elements provided in the second ring oscillator 142. The second latch unit 141 temporarily stores states of signals passing through the respective delay elements at a falling edge of the reference frequency $F_{ref}$, and outputs the state signal as second delay information of the second ring oscillator 124.

The second edge detection unit 143 detects the delay element that makes a state of the second delay information output from the second latch unit 141 be changed from "1" to "0".

The second encoder unit 145 encodes a position of the delay element detected by the second edge detection unit 143 into binary information, and outputs the encoded signal as second fractional frequency information of the second ring oscillator 142.

The second counter unit 144 counts a period of the second ring oscillator 142, and outputs counter information. That is, the counter unit 144 counts a clock signal output from the second ring oscillator 142 from a rising edge to a falling edge of the reference frequency $F_{ref}$, and outputs the counted signal as the second integer frequency information.

The second addition unit 146 outputs the second frequency information obtained by adding the second fractional frequency information output from the second encoder unit 145 to the second integer frequency information output from the second counter unit 144.

The operation unit 160 outputs a digital frequency $F_{dig}$ by calculating a ratio of the frequencies output from the first conversion unit 120 and the second conversion unit 140. That is, if it is assumed that the first frequency information output from the first conversion unit 120 is "a" and the second frequency information output from the second conversion unit 140 is "b", the operation unit 160 outputs $b/a = F_{vco}/f_{ref} = F_{dig}$. Here, since the reference signal $F_{ref}$ is generated through crystal and is a frequency the size of which can be known, the digital frequency $F_{dig}$ corresponds to the value obtained by converting the input oscillation frequency $F_{vco}$ into a digital signal.

Figure 3:
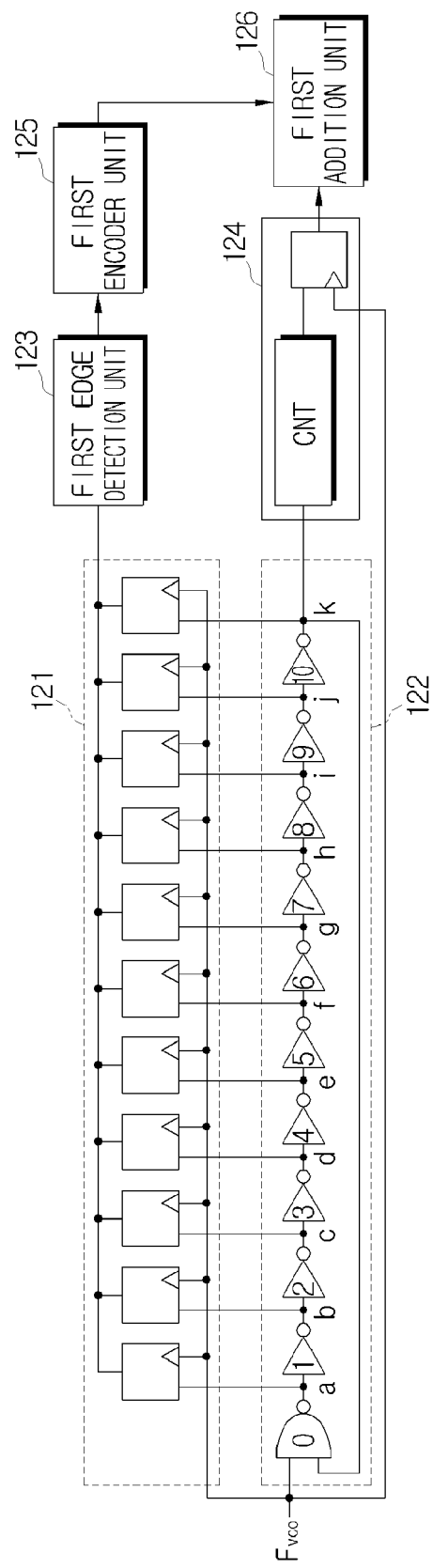
FIG. 3 is a block diagram illustrating in detail the construction of a first conversion unit of the digital frequency detector according to an exemplary embodiment of the present invention.
Figure 4:
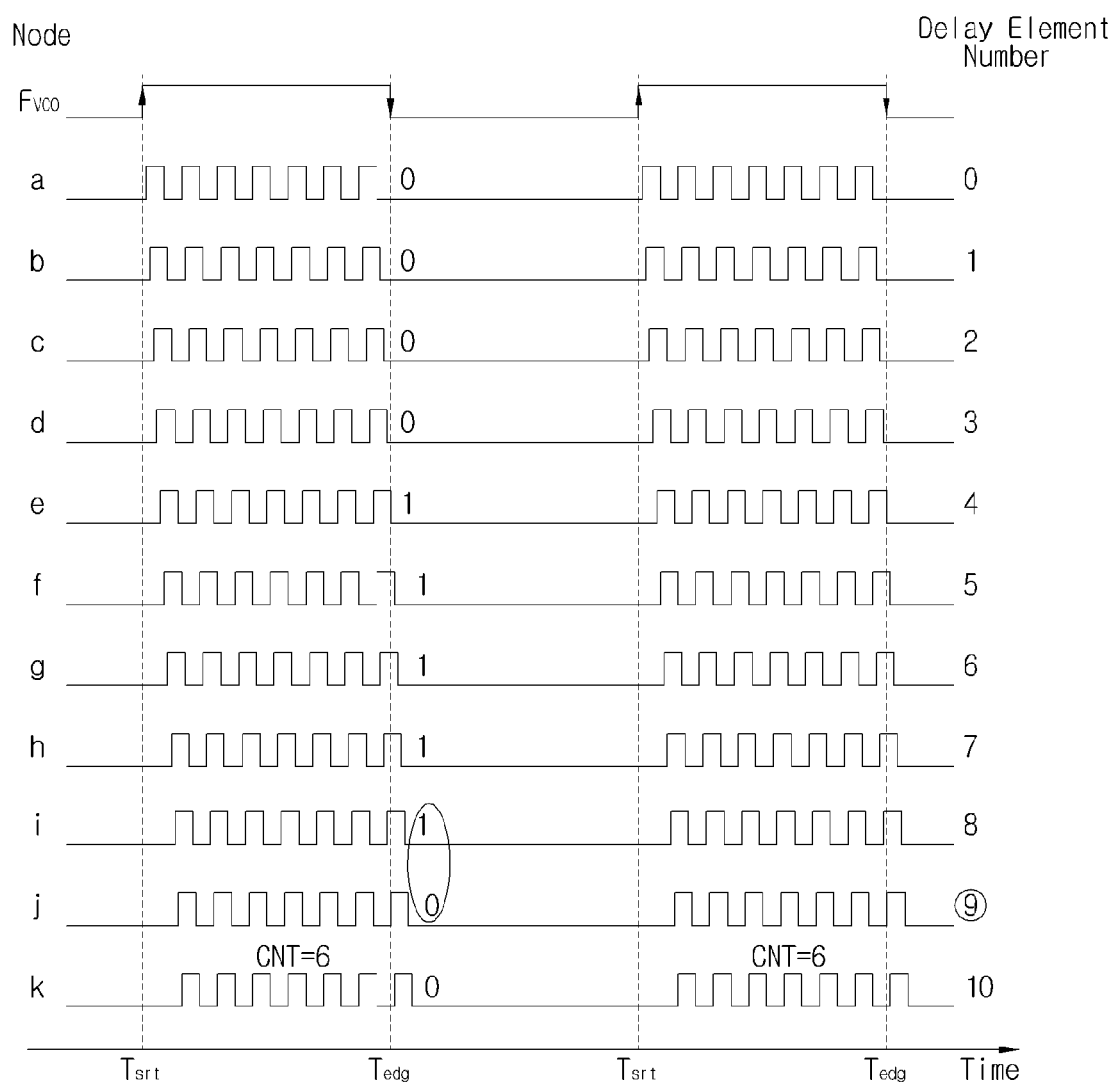
FIG. 4 is a timing diagram explaining the operation of the first conversion unit illustrated in FIG. 3.

FIG. 3 is a block diagram illustrating in detail the construction of the first conversion unit 120 of the digital frequency detector according to an exemplary embodiment of the present invention, and FIG. 4 is a timing diagram explaining the operation of the first conversion unit 120 illustrated in FIG. 3.

In FIG. 3, the first ring oscillator 122 comprises a NAND gate ("0") and 10 inverters ("1" to "10") as delay elements. The first ring oscillator 122 connects the 10 inverters to an output terminal of the NAND gate, and an output signal of the first ring oscillator 122 is fed back to an input terminal of the NAND gate. Through this construction, the first ring oscillator 122 operates if the oscillation frequency $F_{vco}$ is at a high level and does not operate if the oscillation frequency $F_{vco}$ is at a low level.

Alternatively, the first ring oscillator 122 may be of a differential type in which a NAND gate and inverters are combined.

Also, the reference numerals "0" to "10" given to the respective delay elements of the first ring oscillator 122 are used to obtain fractional phase information by encoding the delay information to binary information. In this case, the first latch unit 121 comprises 11 latches, the number of which corresponds to the number of delay elements of the first ring oscillator 122.

The first counter unit 124 comprises a counter CNT for counting the clock signal output from the first ring oscillator 122 from the rising edge to the falling edge of the oscillation frequency $F_{vco}$, and a latch for temporarily storing a counted value.

Referring to FIG. 4, the first counter unit 124 counts the clock signal output from the first ring oscillator 122 from the rising edge $T_{srt}$ to the falling edge $T_{edg}$ of the oscillation frequency $F_{vco}$, and outputs a counted value "6". Then, the first latch unit 121 temporarily stores states of respective nodes a, b, c, . . . , and k, and outputs "00001111100" that is the first delay information.

The first edge detection unit 123 detects the delay element number 9, which makes the state of the signal output from the first latch unit 121 be changed from "1" to "0", from "00001111100". Here, the first encoder unit divides the total number of inverters provided in the first ring oscillator 122 "11" by a numeral "9", and outputs the result, i.e., 9/11=0.8181, as the first fractional frequency information.

The first addition unit 126 adds "6", that is the first integer frequency information output from the first counter unit 124, to "0.8181", that is the first fractional frequency information output from the first encoder unit 125, and outputs "6.8181" that is the first frequency information.

Since the detailed construction and operation of the second conversion unit 140 are the same as those of the first conversion unit 120 as described above with reference to FIGS. 3 and 4, the detailed description thereof will be omitted.

As described above, the digital frequency detector 100 can detect the oscillation frequency $F_{vco}$ in the rate of the reference frequency $F_{ref}$, the size of which is known, using the ring oscillators 122 and 142 that operate at the same frequency.

Figure 5:
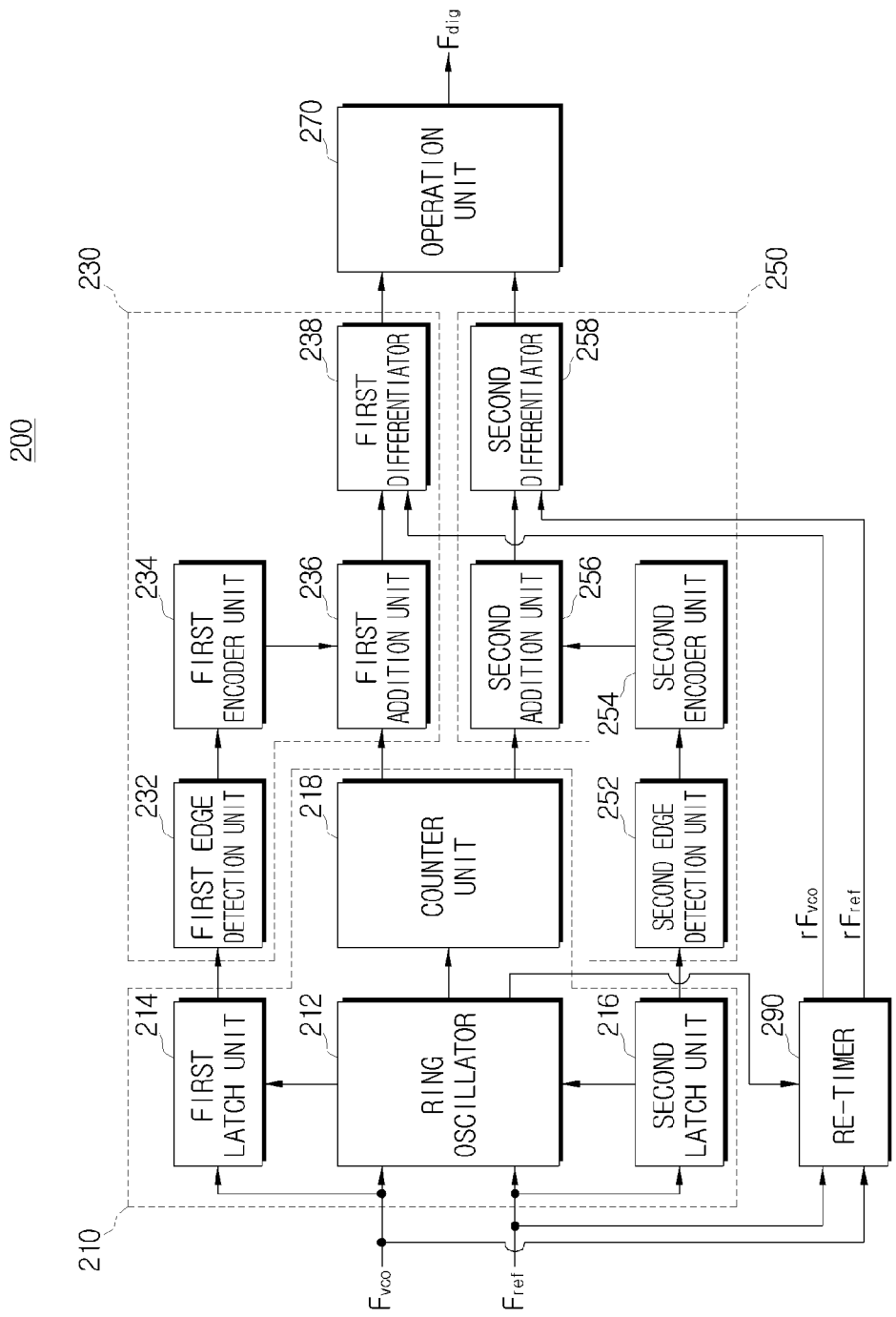
FIG. 5 is a block diagram schematically illustrating the construction of a digital frequency detector according to another exemplary embodiment of the present invention.

FIG. 5 is a block diagram schematically illustrating the construction of the digital frequency detector according to another exemplary embodiment of the present invention.

The digital frequency detector according to another exemplary embodiment of the present invention comprises a quantization unit 210, a first conversion unit 230, a second conversion unit 250, an operation unit 270, and a re-timer 290.

The quantization unit 210 quantizes an oscillation frequency $F_{vco}$ and a reference frequency $F_{ref}$, and outputs quantized frequencies. The quantization unit 210 comprises a ring oscillator 212, a first latch unit 214, a second latch unit 216, and a counter unit 218. Here, the reference frequency Fref is generated through crystal, and is a frequency the size of which can be known.

The ring oscillator 212 comprises an odd number of delay elements connected to a feedback loop, and generates a clock signal of a predetermined frequency.

The first latch unit 214 comprises a plurality of latches, the number of which corresponds to the number of delay elements provided in the ring oscillator 212. The first latch unit 214 temporarily stores states of signals passing through the respective delay elements at a rising edge of the oscillation frequency $F_{vco}$, and outputs the state signal as first delay information of the ring oscillator 212.

The second latch unit 216 also comprises latches the number of which corresponds to the number of delay elements provided in the ring oscillator 212. The second latch unit 216 temporarily stores states of signals passing through the respective delay elements at a rising edge of the reference frequency $F_{ref}$, and outputs the state signal as second delay information of the ring oscillator 212.

The counter unit 218 counts a period of the ring oscillator 212, and outputs counter information. That is, the counter unit 218 counts the clock signal output from the ring oscillator 212 for a period of the oscillation frequency $F_{vco}$, and outputs first integer phase information. Also, the counter unit 218 counts the clock signal output from the ring oscillator 212 for a period of the reference frequency $F_{ref}$, and outputs second integer phase information.

The first conversion unit 230 converts the first delay information output from the first latch unit 214 and the first integer phase information output from the counter unit 218 into a first digital frequency, and outputs the first digital frequency. The first conversion unit 230 comprises a first edge detection unit 232, a first encoder unit 234, a first addition unit 236, and a first differentiator 238.

The first edge detection unit 232 detects the delay element that makes a state of the first delay information output from the first latch unit 214 be changed from "1" to "0".

The first encoder unit 234 encodes a position of the delay element detected by the first edge detection unit 232 into binary information, and outputs the encoded signal as first fractional phase information of the ring oscillator 212.

The first addition unit 226 outputs the first phase information obtained by adding the first fractional phase information output from the first encoder unit 234 to the first integer phase information output from the counter unit 218.

The first differentiator 238 differentiates the first phase information in accordance with a first re-timing clock signal $rF_{vco}$ provided from the re-timer 290 to be described later, and outputs the first digital frequency.

The second conversion unit 250 converts the second delay information output from the second latch unit 216 and the second integer phase information output from the counter unit 218 into a second digital frequency, and outputs the second digital frequency. The second conversion unit 250 comprises a second edge detection unit 252, a second encoder unit 254, a second addition unit 256, and a second differentiator 258.

The second edge detection unit 252 detects the delay element that makes the state of the second delay information output from the second latch unit 216 be changed from "1" to "0".

The second encoder unit 254 encodes a position of the delay element detected by the second edge detection unit 252 into binary information, and outputs the encoded signal as second fractional phase information of the ring oscillator 212.

The second addition unit 256 outputs the second phase information obtained by adding the second fractional phase information output from the second encoder unit 254 to the second integer phase information output from the counter unit 218.

The second differentiator 258 differentiates the second phase information in accordance with a second re-timing clock signal $rF_{ref}$ provided from the re-timer 290 to be described later, and outputs the second digital frequency.

The operation unit 270 outputs a digital frequency $F_{dig}$ by calculating a ratio of the first digital frequency output from the first conversion unit 230 to the second digital frequency output from the second conversion unit 250.

The re-timer 290 rearranges the oscillation frequency $F_{vco}$ and the reference frequency $F_{ref}$ using the clock signal generated from the ring oscillator 212, and outputs the rearrange frequencies to the first differentiator 238 and the second differentiator 258 as the first re-timing clock $rF_{vco}$ and the second re-timing clock $rF_{ref}$.

FIGS. 6 to 9 are views explaining in detail the operation of the digital frequency detector 200 according to another exemplary embodiment of the present invention.

Figure 6:
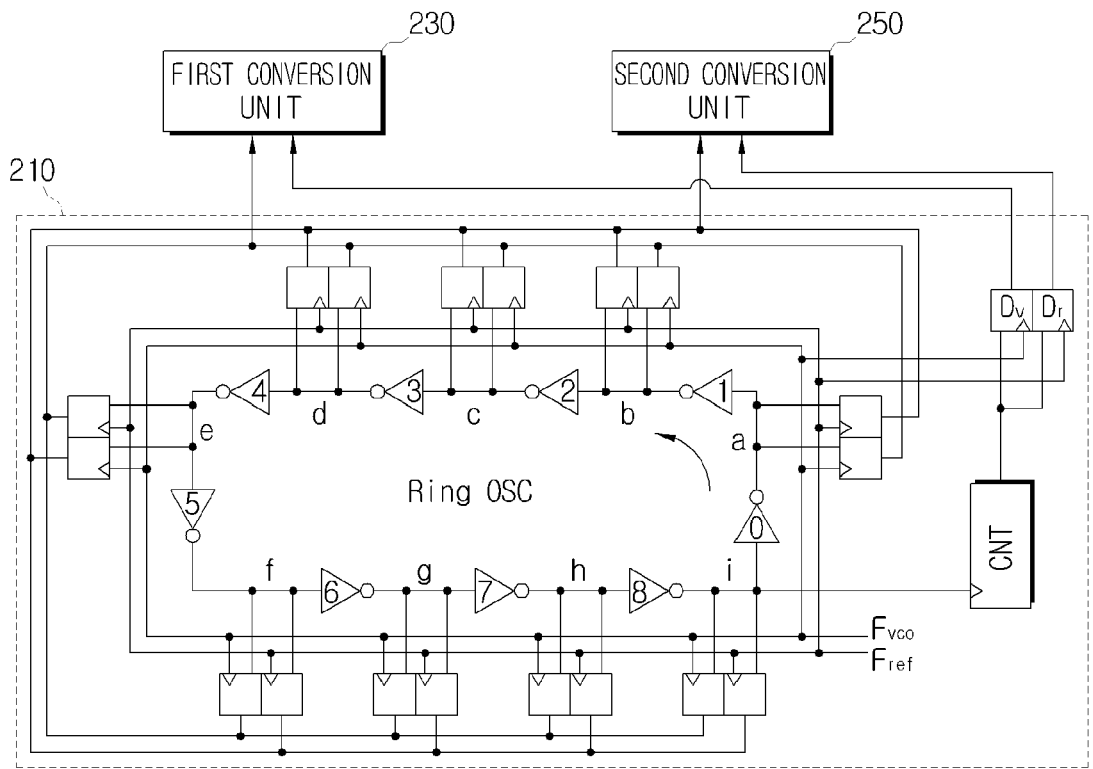
FIG. 6 is an exemplary view illustrating in detail the construction of a quantization unit of the digital frequency detector according to another exemplary embodiment of the present invention.
Figure 7:
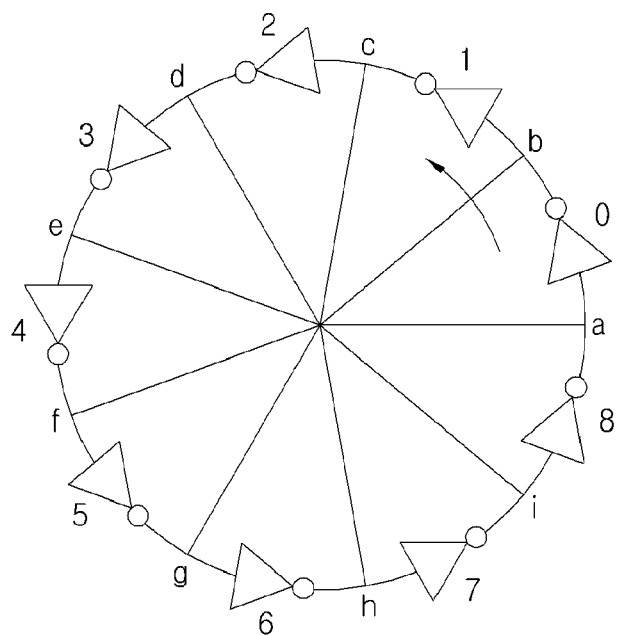
FIG. 7 is a view illustrating the construction of a ring oscillator used in the quantization unit illustrated in FIG. 6.
Figure 8:
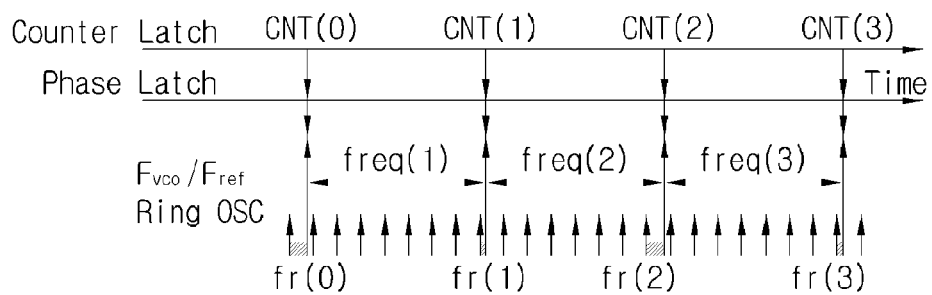
FIG. 8 is a timing diagram explaining the operation of the digital frequency detector according to another exemplary embodiment of the present invention.
Figure 9:
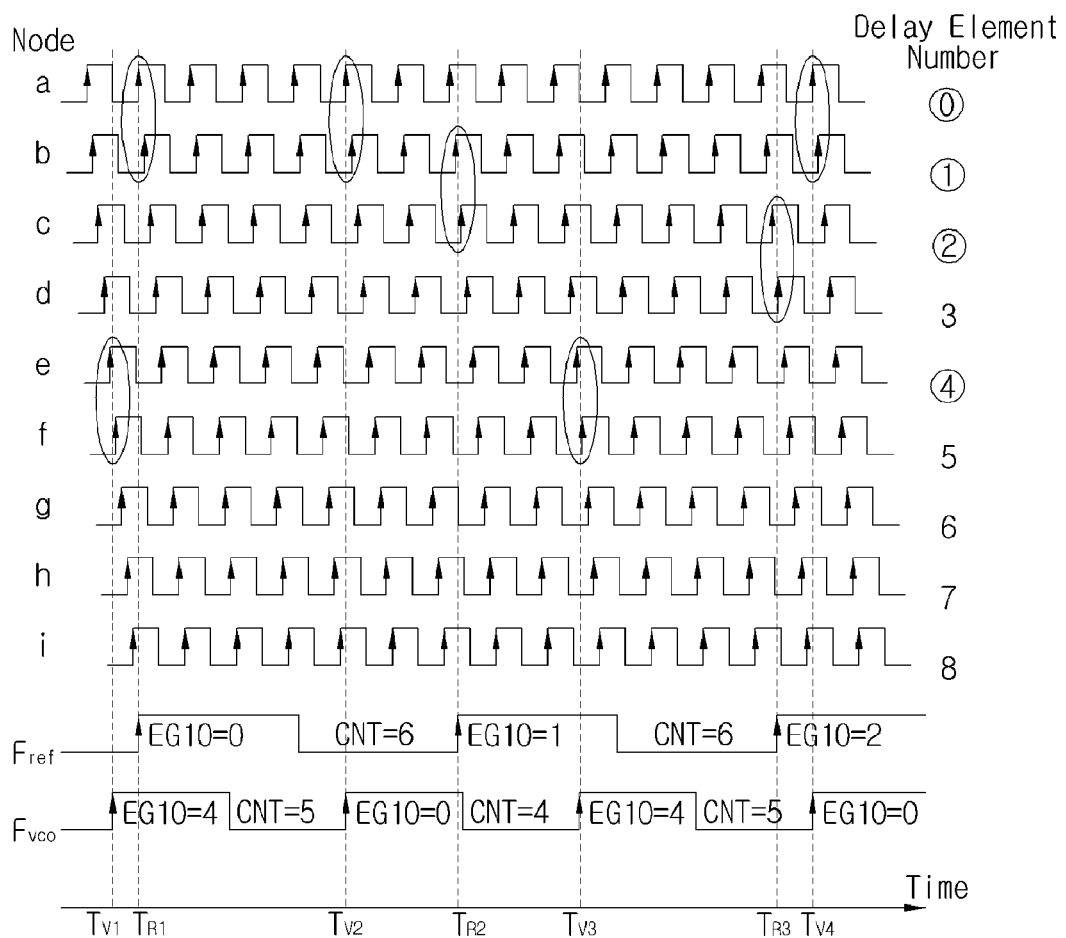
FIG. 9 is a view explaining the operation of conversion units of the digital frequency detector according to another exemplary embodiment of the present invention.

FIG. 6 is an exemplary view illustrating in detail the construction of a quantization unit 210 of the digital frequency detector 200 according to another exemplary embodiment of the present invention, and FIG. 7 is a view illustrating the construction of a ring oscillator 212 used in the quantization unit 210 illustrated in FIG. 6. FIG. 8 is a timing diagram explaining the operation of the digital frequency detector 200 according to another exemplary embodiment of the present invention, and FIG. 9 is a view explaining the operation of conversion units 230 and 250 of the digital frequency detector 200 according to another exemplary embodiment of the present invention.

Referring to FIG. 6, the quantization unit 210 comprises the ring oscillator 212 provided with nine delay elements connected to the feedback loop, the first latch unit 214 having nine latches, and the second latch unit 216 having nine latches.

Here, nine delay elements may comprise inverters, and the respective inverters invert their input signals, respectively. That is, inverter 1 inverts a signal at node a, and outputs an inverted signal to node b. Inverter 2 inverts the signal at node b, and outputs an inverted signal to node c. Inverters 0 and 3 to 8 operate in the same manner as inverters 1 and 2, and thus the ring oscillator 212 generates a clock signal of a predetermined frequency.

Although not illustrated in the drawing, the ring oscillator 212 may be of a differential type in which a NAND gate and inverters are combined.

The number of the latches of the first latch unit 214 and the second latch unit 216 is the same as the number of inverters of the ring oscillator 212. As illustrated in FIG. 6, the first and second latch units temporarily store states of signals detected at nodes a to i, and output the state signals to the first conversion unit 230 and the second conversion unit 250.

As illustrated in FIG. 7, the delay information output from the first latch unit 214 and the second latch unit 216 may be the phase information of the ring oscillator 212, and the numerals "0" to "8" given to the respective delay elements are used to obtain fractional phase information by encoding the delay information to binary information. A method of obtaining the fractional phase information will be described with reference to FIG. 8.

As illustrated in FIG. 8, nine latches that constitute the first latch unit 214 temporarily store states of signals detected at nodes a to i at the first rising edge $T_{V1}$ of the oscillation frequency $F_{vco}$ and output "011110000". Here, the first edge detection unit 232 detects inverter 4 that makes the signal state at the first rising edge $T_{V1}$ be changed from "1" to "0". Also, the first encoder unit 234 divides the numeral "4" by "9" that is the total number of inverters provided in the ring oscillator 212, and outputs "4/9=0.444" as the first fractional phase information.

The nine latches that constitute the second latch unit 216 temporarily store states of signals detected at nodes a to i at the first rising edge $T_{R1}$ of the reference frequency $F_{ref}$, and output "100001111". Here, the second edge detection unit 252 detects inverter 0 that makes the signal state at the first rising edge TRI be changed from "1" to "0". Also, the second encoder unit 254 outputs "0/9=0" as the second fractional phase information.

The counter CNT counts the number of clocks output from the ring oscillator 212, and an oscillation latch $D_v$ connected to the counter CNT temporarily stores the number of clocks output from the ring oscillator 212 at the first rising edge $T_{V1}$ to output the number of clocks temporarily stored as the first integer phase information. A reference latch $D_r$ connected to the counter CNT temporarily stores the number of clocks output from the ring oscillator 212 at the first rising edge $T_{R1}$ to output the number of clocks temporarily stored as the second integer phase information.

Referring to FIGS. 8 and 9, the digital frequency of the oscillation frequency $F_{vco}$ is the value obtained by dividing the frequency of the ring oscillator 212 by the oscillation frequency $F_{vco}$ as in Equation (1).

$$\text{freq}(n) = F(\text{Ring } OSC)/F_{vco} = CNT(n) - CNT(n-1) - 1 + fr(n) + 1 - fr(n-1) \tag{1}$$

In Equation (1), freq(n) denotes a digital frequency detected at the n-th rising edge $T_{Vn}$, CNT(n) the first integer phase information output at the n-th rising edge $T_{Vn}$, CNT(n−1) the first integer phase information output at the (n−1)-th rising edge $T_{Vn-1}$, fr(n) the first fractional phase information output at the n-th rising edge $T_{Vn}$, and fr(n−1) the first fractional phase information output at the (n−1)-th rising edge $T_{Vn-1}$, respectively.

Consequently, it can be known that the digital frequency becomes freq(n)={CNT(n)−CNT(n−1)}+(fr(n)−fr(n−1)}. The digital frequency of the reference frequency $F_{ref}$ can be obtained in the same manner as the obtaining of the oscillation frequency $F_{vco}$.

Accordingly, with reference to the timing diagram of FIG. 8, the fractional phase information fr output from the first encoder unit 234 at the first to third rising edges $T_{V1}$ to $T_{V3}$ is given in Equation (2)

$$fr(T_{V1})=4/9=0.444; fr(T_{V2})=0/9=0; fr(T_{V3})=4/9=0.444;$$
$$fr(T_{V4})=0/9=0 \quad (2)$$

With reference to Equation (1) and Equation (2), as a result of calculating the digital frequency, the first digital frequency $dF_{VCO}$ as given in Equation (3) is output from the first conversion unit 230.

$$dF_{VCO}(T_{V2}-T_{V1})=CNT(T_{V2})-CNT(T_{V1})+fr(T_{V2})-fr(T_{V1})=5-0.444=4.555$$

$$dF_{VCO}(T_{V3}-T_{V2})=CNT(T_{V3})-CNT(T_{V2})+fr(T_{V3})-fr(T_{V2})=4+0.444=4.444 \quad (3)$$

$$dF_{VCO}(T_{V4}-T_{V3})=CNT(T_{V4})-CNT(T_{V3})+fr(T_{V4})-fr(T_{V3})=5-0.444=4.555$$

In the same manner, the fractional phase information fr output from the second encoder unit 254 at the first to third rising edges $T_{R1}$ to $T_{R3}$ is given in Equation (4).

$$fr(T_{R1})=0/9=0; fr(T_{R2})=1/9=0.111; fr(T_{R3})=2/9=0.222 \quad (4)$$

With reference to Equation (1) and Equation (4), as a result of calculating the digital frequency, the second digital frequency $dF_{ref}$ as given in Equation (5) is output from the first conversion unit 230.

$$dF_{ref}(T_{R2}-T_{R1})=CNT(T_{R2})-CNT(T_{R1})+fr(T_{R2})-fr(T_{R1})=6+0.111=6.111$$

$$dF_{ref}(T_{V3}-T_{V2})=CNT(T_{V3})-CNT(T_{V2})+fr(T_{V3})-fr(T_{V2})=6+0.111=6.111$$

Lastly, the operation unit 270 operates the ratio of the first digital frequency $F_{vco}$ output from the first conversion unit 230 to the second digital frequency $F_{ref}$ output from the second conversion unit 250, and outputs the digital frequency $F_{dig}$ obtained as a result of operation. The digital frequency $F_{dig}$ finally output is operated in Equation (6).

$$F_{dig}=dF_{ref}/dF_{VCO}=6.111/4.555=1.3416 \text{ or } 6.111/4.111=1.3751 \quad (6)$$

Figure 10:
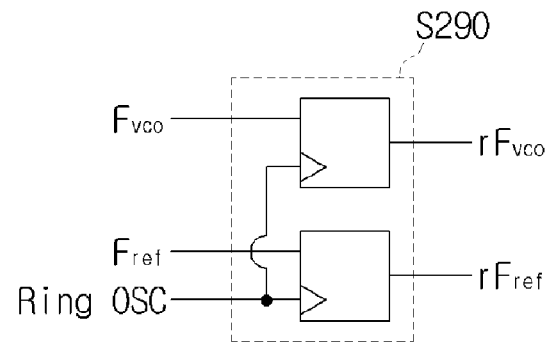
FIG. 10 is a view illustrating the construction of a re-timer of the digital frequency detector according to another exemplary embodiment of the present invention.

FIG. 10 is a view illustrating the construction of a re-timer 290 of the digital frequency detector according to another exemplary embodiment of the present invention.

Referring to FIG. 10, the re-timer 290 comprises two latches. Each latch rearranges the oscillation frequency $F_{VCO}$ and the second frequency $F_{ref}$ using the clock signal Ring OSC generated from the ring oscillator 212, and provides the rearranged frequencies as the first re-timing clock signal $rF_{VCO}$ and the second re-timing clock signal $rF_{ref}$.

Figure 11:
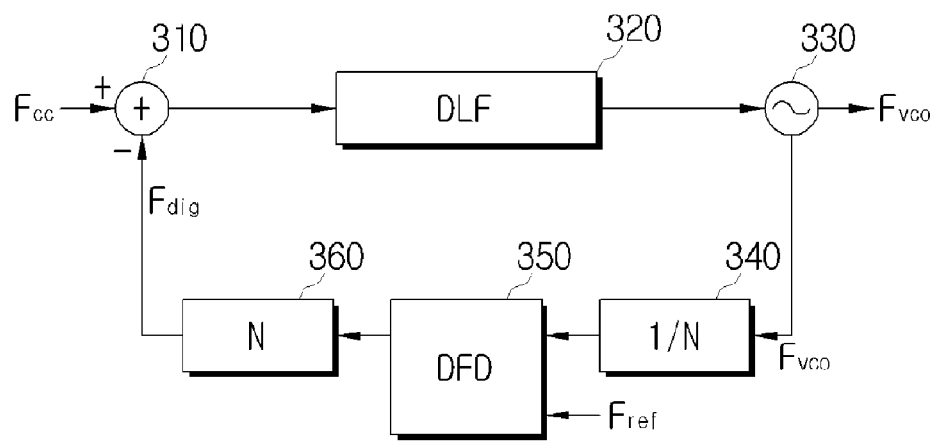
FIG. 11 is a block diagram schematically illustrating the construction of a digital PLL to which the digital frequency detector according to embodiments of the present invention is applied.

FIG. 11 is a block diagram schematically illustrating the construction of a digital PLL to which the digital frequency detector according to embodiments of the present invention is applied.

Referring to FIG. 11, the digital PLL comprises a detector 310, a digital loop filter (DLF) 320, a digital controlled oscillator (DCO) 330, a divider (1/N) 340, a digital frequency detector (DFD) 350, and a multiplier (N) 360.

The detector 310 compares an input frequency $F_{cc}$ with the frequency $F_{dig}$ output from the multiplier 360 to be described later, and outputs an error value corresponding to a difference between the two frequencies.

The DLF 320 adjusts a control value for controlling the oscillation frequency $F_{VCO}$ that is output when the error value output from the detector 310 exceeds the permitted limit of the digital PLL according to the error value.

The DCO 330 outputs the high-frequency oscillation frequency $F_{VCO}$ by controlling the fixed frequency input from a fixed frequency oscillator (not illustrated) according to the control value output from the DLF 320.

The divider 340 divides the high-frequency oscillation frequency $F_{VCO}$ output from the VCO 330 by a specified integer value N, and outputs the divided frequency as the low-frequency oscillation frequency $F_{VCO}$.

The DFD 350 converts the ratio of the low-frequency oscillation frequency $F_{VCO}$ to the reference frequency $F_{ref}$ into a digital value, and outputs the digital value as the digital frequency $F_{dig}$. The digital frequency detectors 100 and 200 according to embodiments of the present invention may be applied as the DFD 350.

The multiplier 360 multiplies the digital frequency $F_{dig}$ output from the DFD 350 by the integer value N, and outputs the multiplied frequency as the high-frequency digital frequency $F_{dig}$.

In the exemplary embodiments of the present invention as described above, the digital PLL can be implemented by employing the digital frequency detectors 100 and 200 that convert the ratio of two frequencies into a digital value. The digital frequency detector according to the present invention can also be applied to a frequency synthesizer designed in a digital domain.

As described above, according to the exemplary embodiments of the present invention, the frequency of a high-frequency signal is detected as a digital signal having a high precision using a ring oscillator, and thus a high-performance digital frequency detector can be provided in designing a circuit, which had been designed in an analog domain, in a digital domain.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A digital frequency detector comprising:
   a first conversion unit which comprises a first ring oscillator and outputs a first frequency as first frequency information using the first ring oscillator that operates in a high-level period of the first frequency, wherein the first frequency information is digital information;
   a second conversion unit which comprises a second ring oscillator and outputs a second frequency as second frequency information using the second ring oscillator that operates in a high-level period of the second frequency, wherein the second frequency information is digital information; and an operation unit which outputs a digital frequency for the first frequency by calculating a ratio of the first frequency information to the second frequency information, wherein the first ring oscillator is a differential type oscillator.

2. The digital frequency detector of claim 1, wherein the first frequency information and the second frequency information comprise information in which fractional frequency information and integer frequency information are added together.

3. The digital frequency detector of claim 1, wherein the first ring oscillator and the second ring oscillator operate at a same frequency.

4. The digital frequency detector of claim 1, wherein the first ring oscillator comprises a plurality of delay elements, and the first conversion unit further comprises:

a first latch unit which temporarily stores states of signals passing through the respective delay elements of the first ring oscillator at a falling edge of the first frequency, and outputs a state signal as delay information of the first ring oscillator, the first latch unit comprising a plurality of latches corresponding in number to a number of the delay elements of the first ring oscillator;

a first edge detection unit which detects a delay element that makes a state of the delay information be changed from "1" to "0";

a first encoder unit which encodes a position of the delay element detected by the first edge detection unit into binary information, and outputs the encoded signal as fractional frequency information of the first ring oscillator;

a first counter unit which counts a period of the first ring oscillator, and outputs a counted value as integer frequency information; and a first addition unit which outputs the first frequency information obtained by adding the fractional frequency information to the integer frequency information.

5. The digital frequency detector of claim 4, wherein the first counter unit counts a clock signal output from the first ring oscillator from a rising edge to the falling edge of the first frequency to generate the counted value that is output as the integer frequency information.

6. The digital frequency detector of claim 1, wherein the second ring oscillator comprises a plurality of delay elements, and the second conversion unit further comprises:

a second latch unit which temporarily stores states of signals passing through the respective delay elements of the second ring oscillator at a falling edge of a second frequency, and outputs the state signal as delay information of the second ring oscillator, the second latch unit comprising a plurality of latches corresponding in number to a number of the delay elements of the second ring oscillator;

a second edge detection unit which detects a delay element that makes a state of the delay information be changed from "1" to "0";

a second encoder unit which encodes a position of the delay element detected by the second edge detection unit into binary information, and outputs the encoded signal as fractional frequency information of the second ring oscillator;

a second counter unit which counts a period of the second ring oscillator, and outputs a counted value as integer frequency information; and a second addition unit which outputs the second frequency information obtained by adding the fractional frequency information to the integer frequency information.

7. The digital frequency detector of claim 6, wherein the second counter unit counts a clock signal output from the second ring oscillator from a rising edge to the falling edge of the second frequency to generate the counted value which is output as the integer frequency information.

8. A digital frequency detector comprising:

a quantization unit which comprises a ring oscillator and quantizes a first frequency and a second frequency using the ring oscillator;

a first conversion unit which outputs the first frequency as first frequency information using quantized information of the first frequency, wherein the first frequency information is digital information;

a second conversion unit which outputs the second frequency as second frequency information using quantized information of the second frequency, wherein the second frequency information is digital information; and an operation unit which outputs a digital frequency for the first frequency by calculating a ratio of the first frequency information to the second frequency information.

9. The digital frequency detector of claim 8, wherein the first frequency information and the second frequency information comprise information in which fractional frequency information and integer frequency information are added together.

10. The digital frequency detector of claim 8, wherein the ring oscillator comprises an odd number of inverters provided in a feedback loop as delay elements.

11. The digital frequency detector of claim 8, wherein the ring oscillator is a differential type oscillator.

12. The digital frequency detector of claim 9, wherein the ring oscillator comprises a plurality of delay elements, and the quantization unit further comprises:

a first latch unit which temporarily stores states of signals passing through the respective delay elements at a falling edge of the first frequency, and outputs a state signal as first delay information of the ring oscillator, the first latch unit comprising a plurality of latches corresponding in number to the number of delay elements of the ring oscillator;

a second latch unit which temporarily stores states of signals passing through the respective delay elements at a falling edge of the second frequency, and outputs a state signal as second delay information of the ring oscillator, the second latch unit comprising a plurality of latches the number corresponding in number to the number of delay elements of the ring oscillator; and a counter unit which outputs first integer phase information by counting a period of the ring oscillator for a period of the first frequency, and outputs second integer phase information by counting the period of the ring oscillator for a period of the second frequency.

13. The digital frequency detector of claim 12, wherein the first conversion unit comprises:

a first edge detection unit which detects a delay element that makes a state of the first delay information be changed from "1" to "0";

a first encoder unit which encodes a position of the delay element detected by the first edge detection unit into binary information, and outputs the encoded signal as first fractional phase information of the ring oscillator;

a first addition unit which outputs first phase information obtained by adding the first fractional phase information to the first integer phase information; and a first differentiator which differentiates the first phase information and outputs the differentiated fist phase information as the first frequency information.

14. The digital frequency detector of claim 8, wherein the second conversion unit comprises:

a second edge detection unit which detects a delay element that makes a state of the second delay information be changed from "1" to "0";

a second encoder unit which encodes a position of the delay element detected by the second edge detection unit into binary information, and outputs the encoded signal as second fractional phase information of the ring oscillator;

a second addition unit which outputs second phase information obtained by adding the second fractional phase information to the second integer phase information; and a second differentiator which differentiates the second phase information and outputs the differentiated second phase information as the second frequency information.

15. The digital frequency detector of claim 8, further comprising a re-timer which rearranges the first frequency and the second frequency using a clock signal generated by the ring oscillator and provides the rearranged first and second frequencies as clock signals of the first conversion unit and the second conversion unit, respectively.

16. The digital frequency detector of claim 15, wherein the re-timer comprises:

a first latch which latches the first frequency according to the clock signal generated by the ring oscillator; and a second latch which latches the second frequency according to the clock signal generated from the ring oscillator.

17. A digital phase locked loop (PLL) comprising:

a detection unit which compares a first digital frequency with a second digital frequency and outputs an error value corresponding to a difference between the first and second digital frequencies;

a filter unit which adjusts and outputs a control value for controlling an output frequency according to the error value output from the detection unit so that the error value is included within a predetermined limit;

an oscillator which outputs a high-frequency oscillation frequency by controlling a fixed frequency input from a fixed frequency oscillator according to the control value output from the filter unit; and a digital frequency detector which outputs a second digital frequency using a ratio of frequency information of the oscillation frequency to frequency information of a reference frequency, wherein the frequency information is digital information, wherein the digital frequency detector comprises:

a quantization unit which comprises a ring oscillator and quantizes a first frequency and a second frequency using the ring oscillator;

a first conversion unit which outputs the first frequency as first frequency information using quantized information of the first frequency, wherein the first frequency information is digital information;

a second conversion unit which outputs the second frequency as second frequency information using quantized information of the second frequency, wherein the second frequency information is digital information; and an operation unit which outputs a digital frequency for the first frequency by calculating a ratio of the first frequency information to the second frequency information.

18. The digital PLL of claim 17, further comprising:

a divider which divides the high-frequency oscillation frequency output from the oscillator by a specified integer and outputs the divided frequency as a low-frequency oscillation frequency; and a multiplier which multiplies the second digital frequency output from the digital frequency detector by the integer and outputs the multiplied frequency as the second high-frequency digital frequency.

19. The digital PLL of claim 17, wherein the digital frequency detector comprises:

a first conversion unit which comprises a first ring oscillator and outputs a first frequency as first frequency information using the first ring oscillator that operates in a high-level period of the first frequency, wherein the first frequency information is digital information;

a second conversion unit which comprises a second ring oscillator and outputs a second frequency as second frequency information using the second ring oscillator that operates in a high-level period of the second frequency, wherein the second frequency information is digital information; and an operation unit which outputs a digital frequency for the first frequency by calculating a ratio of the first frequency information to the second frequency information.

* * * * *